(12) United States Patent
Yanagi et al.

(10) Patent No.: US 8,502,397 B2
(45) Date of Patent: Aug. 6, 2013

(54) HEAT-RESISTANT ADHESIVE SHEET FOR SEMICONDUCTOR DEVICE FABRICATION, ADHESIVE USED FOR THE SHEET, AND METHOD FOR FABRICATING SEMICONDUCTOR DEVICE USING THE SHEET

(75) Inventors: Yuichiro Yanagi, Osaka (JP); Kazuyuki Kiuchi, Osaka (JP); Shinji Hoshino, Osaka (JP)

(73) Assignee: Nitto Denko Corporation, Osaka (JP)

( * ) Notice: Subject to any disclaimer, the term of this patent is extended or adjusted under 35 U.S.C. 154(b) by 32 days.

(21) Appl. No.: 12/970,282

(22) Filed: Dec. 16, 2010

(65) Prior Publication Data

US 2011/0143552 A1    Jun. 16, 2011

(30) Foreign Application Priority Data

Dec. 16, 2009   (JP) .................. 2009-285570

(51) Int. Cl.
*H01L 23/28* (2006.01)
(52) U.S. Cl.
USPC ......................................... 257/787; 257/723
(58) Field of Classification Search
USPC ................ 257/678, 687, 701, 723, 787–788, 257/793, E23.116, E23.117, E23.119, E23.121; 438/113, 118–119, 127
See application file for complete search history.

(56) References Cited

U.S. PATENT DOCUMENTS

| 2005/0046021 | A1 | 3/2005 | Hoshokawa |
| 2008/0102284 | A1* | 5/2008 | Hong et al. .................. 428/413 |

FOREIGN PATENT DOCUMENTS

| JP | 2001-308116 | 11/2001 |
| JP | 2001-313350 | 11/2001 |
| JP | 2007-129016 | 5/2007 |
| JP | 2007129016 A * | 5/2007 |
| JP | 2008-101183 | 5/2008 |

OTHER PUBLICATIONS

European Search Report issued in Application No. 10194137.5 dated Mar. 24, 2011.

* cited by examiner

*Primary Examiner* — Jarrett Stark
*Assistant Examiner* — Michele Fan
(74) *Attorney, Agent, or Firm* — Sughrue Mion, PLLC

(57) ABSTRACT

The present invention provides a heat-resistant adhesive sheet for semiconductor device fabrication that is attached to a substrateless semiconductor chip when the chip is encapsulated with resin. The adhesive sheet includes a base material layer and an adhesive layer. The adhesive layer contains a rubber component and an epoxy resin component. The proportion of the rubber component in an organic substance in the adhesive is in the range of 20 to 60 wt %.

6 Claims, 3 Drawing Sheets

HEAT-RESISTANT ADHESIVE SHEET FOR SEMICONDUCTOR DEVICE FABRICATION, ADHESIVE USED FOR THE SHEET, AND METHOD FOR FABRICATING SEMICONDUCTOR DEVICE USING THE SHEET

CROSS REFERENCE TO RELATED APPLICATIONS

The disclosure of Japanese Patent Application No. 2009-285570 filed on Dec. 16, 2009 including the specification, drawings and abstract is incorporated herein by reference in its entirely.

BACKGROUND OF THE INVENTION

1. Field of the Invention

The present invention relates to a heat-resistant adhesive sheet for semiconductor device fabrication used for fabrication of substrateless semiconductor packages that do not use a metal lead frame, an adhesive used for the sheet, and a method for fabricating a semiconductor device using the sheet.

2. Description of the Related Art

Among LSI packaging technologies, Chip Size/Scale Package (CSP) technologies have recently come into attention. Among those technologies, a package form that does not use a substrate and packs only chips, such as Wafer Level Package (WLP), is especially attractive in terms of packaging density and size reduction. In a WLP fabrication method, multiple semiconductor Si wafer chips orderly arranged without the use of a substrate are encapsulated with an encapsulation resin at a time and then the wafer is diced into individual structures. Thus the method enables packages smaller than conventional ones that use a substrate to be fabricated efficiently.

In such a WLP fabrication method, chips, which are conventionally fixed on a substrate, need to be fixed on an alternative supporter. Furthermore, since the chips need to be unfixed after the chips have been encapsulated with resin and formed into individual packages, the supporter need to be removable, instead of permanent bonding fixation. Therefore, an approach to using an adhesive tape as such a supporter for temporarily fixing chips is known.

For example, Japanese Patent Laid-Open No. 2001-308116 describes a chip electronic component fabrication method that includes the steps of: attaching acrylic resin adhesion means onto a substrate, the adhesive means being adhesive before processing but the adhesion strength decreases after the processing; fixing a plurality of semiconductor chips of the same type or different types onto the adhesion means with an electrode-formed surface down; coating a whole area including interspaces between the plurality of semiconductor chips of the same type or different types with a protective material; applying predetermined processing to reduce the adhesion strength of the adhesion means and peeling off a pseudo wafer on which the semiconductor chips are fixed from the semiconductor chips; and cutting the protective material between the plurality of semiconductor chips of the same type or different types to separate the semiconductor chips or chip electronic components.

Japanese Patent Laid-Open No. 2001-313350 describes a hip electronic component fabrication method that includes the steps of: attaching acrylic resin adhesion means onto a substrate, the adhesive means being adhesive before processing but the adhesion strength decreases after the processing; fixing a plurality of semiconductor chips of the same type or different types onto the adhesion means with an electrode-formed surface down; coating a whole area including interspaces between the plurality of semiconductor chips of the same type or different types with a protective material; removing the protective material from the area from the side opposite of the electrode-formed side to the side opposite of the semiconductor chips; applying predetermined processing to reduce the adhesion strength of the adhesion means and peeling off a pseudo wafer on which the semiconductor chips are fixed from the semiconductor chips; and cutting the protective material between the plurality of semiconductor chips of the same type or different types to separate the semiconductor chips or chip electronic components.

Indeed, according to these methods, the protection of the chips also protects the chips during mounting/handling after dicing and the packaging density can be improved.

Japanese Patent Laid-Open No. 2008-101183 describes a dicing/die bonding tape including an adhesive layer containing epoxy resin and acrylic rubber and a method for bonding a semiconductor device resulting from dicing onto a supporter. Obviously, the method is not intended for substrateless semiconductor devices and the adhesive layer is chosen by taking into consideration the adhesiveness to a substrate.

The following problems can arise with the following method for fabricating a substrateless semiconductor package using an adhesive tape as a temporary supporter.

The problems will be described below with reference to FIG. 1, which illustrates the substrateless semiconductor device fabrication method.

A heat-resistant adhesive sheet 2 for semiconductor device fabrication includes an adhesive layer 12 on one side and a substrate fixing bond layer 13 on the other side. Multiple chips 1 are attached onto the adhesive layer 12 of the heat-resistant adhesive sheet 2 for semiconductor device fabrication and the sheet 2 is fixed on a substrate 3 with the substrate fixing bond layer 13 to form a structure illustrated in part (a) of FIG. 1. Alternatively, the heat-resistant adhesive sheet 2 for semiconductor device fabrication is attached onto a substrate 3 and chips 1 are fixed on the heat-resistant adhesive sheet 2 for semiconductor device fabrication to form the structure depicted in part (a) of FIG. 1.

Then, the chips 1 on the structure depicted in part (a) are encapsulated together with an encapsulation resin 4 to form a structure illustrated in part (b) of FIG. 1.

Then, as illustrated in part (c), the heat-resistant adhesive sheet 2, together with the substrate 3, is removed from the multiple chips 1 encapsulated with the encapsulation resin 4, or the multiple chips 1 encapsulated with the encapsulation resin 4 and the heat-resistant adhesive sheet 2 are removed together from the substrate 3 and then the heat-resistant adhesive sheet 2 for semiconductor device fabrication is removed from the chips 1, thereby obtaining the multiple chips 1 encapsulated with the encapsulation resin 4.

Electrodes 5 are formed in desired positions on surfaces of the chips 1 encapsulated with the encapsulation resin 4 that are exposed on the side on which the heat-resistant adhesive sheet 2 for semiconductor device fabrication is provided, thereby forming a structure depicted in part (d).

For the step of dicing, a dicing tape 8 having a dicing ring 7 provided on its encapsulation resin 4 side as required is bonded to the structure to fix the chips 1 encapsulated with the encapsulation resin 4. The structure is diced with a dicing blade 6 as depicted in part (e) to ultimately provide multiple substrateless packages in which multiple chips are encapsulated with the resin as depicted in part (f).

During the resin encapsulation, the heat-resistant adhesive sheet 2 for semiconductor device fabrication illustrated in FIG. 2(a) can be deformed in planar directions due to expansion and elasticity of a base material layer or the adhesive layer of the heat-resistant adhesive sheet 2 for semiconductor device fabrication as illustrated in FIG. 2(b). Accordingly, the positions of the chips 1 provided on the heat-resistant adhesive sheet 2 for semiconductor device fabrication can move.

As a result, when the electrodes are provided on the chips 1, relative positional relationship between the chips 1 and the electrodes would have changed from the originally designed relationship. Furthermore, during dicing of the chips 1 encapsulated with resin, the dicing line based on the positions of the chips 1 predetermined for the dicing step would be different from the dicing line required by the actual positions of the chips 1.

Consequently, the positions of chips encapsulated in the packages resulting from dicing would vary from one package to another and a subsequent electrode formation step would not smoothly be performed and partially encapsulated packages would result.

When the heat-resistant adhesive sheet 2 for semiconductor device fabrication is peeled away from the resin-encapsulated chips, an adhesive formed on the chip side of the heat-resistant adhesive sheet 2 for semiconductor device fabrication exhibits heavy peeling from the chips or the encapsulation resin, depending on the properties of the adhesive. Therefore it can be difficult to peel off the heat-resistant adhesive sheet 2 for semiconductor device fabrication, or adhesive deposits 9 as illustrated in FIG. 3 can occur or static electricity can build up during peeling.

As peeling becomes difficult, more time is required accordingly. Heavy peeling therefore can lead to reduction in productivity. Adhesive deposits 9 can inhibit a subsequent step such as electrode formation. Static electricity build-up caused by peeling leads to a problem due to adhesion of dust in a subsequent step.

As has been described, chips can be displaced from specified positions by pressure applied during resin encapsulation because the chips are not properly held in the substrateless semiconductor package fabrication method using a heat-resistant adhesive sheet 2 for semiconductor device fabrication as a supporter for temporary fixture. When the heat-resistant adhesive sheet 2 for semiconductor device fabrication is peeled off, packages can be damaged by adhesion strength to the chips increased by curing of the encapsulation material or heat.

Furthermore, if gas is generated from the adhesive layer or part of the adhesive is eluted from the adhesive layer under heat generated during use of the device, the gas or adhesive can contaminate the surfaces of the chips and subsequent steps such as the electrode formation step cannot reliably be performed, thus resulting in poor connections.

These problems are specific to substrateless semiconductor device fabrication methods not suffered by other methods such as the method described in Japanese Patent Laid-Open No. 2008-101183.

SUMMARY OF THE INVENTION

Means for solving the problems is as follows.

A heat-resistant adhesive sheet for semiconductor device fabrication is attached to a substrateless semiconductor chip when the substrateless semiconductor chip is encapsulated with resin. The heat-resistant adhesive sheet includes a base material layer and an adhesive layer. The adhesive layer contains a rubber component and an epoxy resin component. The proportion of the rubber component in an organic substance in the adhesive is in the range of 20 to 60 wt %.

Alternatively, the epoxy resin component may have a weight per epoxy equivalent of less than or equal to 1000 g/eq, the adhesive layer may contain a conductive filler to impart electrical conductivity and high elasticity to the adhesive layer.

Furthermore, there is provided a semiconductor device fabrication method that resin-encapsulates a substrateless semiconductor chip using the heat-resistant adhesive sheet 2 for semiconductor device fabrication, instead of a metal lead frame.

The present invention provides an adhesive sheet for temporarily fixing chips, used in a method for fabricating a substrateless semiconductor package that does not use a metal lead frame (for example a method for fabricating WLP), an adhesive used in the adhesive sheet, and a method for fabricating a semiconductor device using the adhesive sheet. The adhesive of the present invention contains an appropriate content of a rubber component to add flexibility to the adhesive sheet without impairing heat resistance of the adhesive sheet. Accordingly, the adhesive sheet exhibits good machinability in cutting of the adhesive sheet.

Therefore, the adhesive sheet holds the chips so that the chips are not displaced from specified positions during resin encapsulation and does not leave adhesive deposits after the adhesive sheet has been used. Furthermore, contamination with outgas and eluted substances does not occur and an adhesive does not melt and attach during heating. Consequently, defects are not caused in forming electrodes and interconnects on chip surfaces.

The present invention can improve the fabrication yield of the semiconductor packages.

| Description of Symbols | |
| --- | --- |
| 1: | Chip |
| 2: | Heat-resistant adhesive sheet for semiconductor device fabrication |
| 3: | Substrate |
| 4: | Encapsulation resin |
| 5: | Electrode |
| 6: | Dicing blade |
| 7: | Dicing ring |
| 8: | Dicing tape |
| 9: | Adhesive deposit |
| 10: | Flat, smooth peeling sheet |
| 11: | Base material layer |
| 12: | Adhesive layer |
| 13: | Substrate fixing bond layer |

DETAILED DESCRIPTION OF THE PREFERRED EMBODIMENTS

The present inventor has diligently worked on adhesive sheets and has found that the use of a certain rubber-epoxy-based adhesive in the adhesive layer of a heat-resistant adhesive sheet for semiconductor device fabrication allows the adhesive sheet to exhibit high heat resistance after curing, appropriate adhesion to semiconductor packages during resin encapsulation, and good peelability after the resin encapsulation without leaving adhesive deposits, as described in description of means for solving the problems. The present inventor has thus made the present invention.

The present invention provides a heat-resistant adhesive sheet for semiconductor device fabrication that is attached to substrateless semiconductor chips that do not use a metal lead frame when the chips are encapsulated with resin. The heat-resistant adhesive sheet includes a base material layer and an adhesive layer. The adhesive layer contains a rubber component and an epoxy resin component. The proportion of the rubber component in an organic substance in the adhesive is in the range of 20 to 60 wt %.

According to the present invention, since the adhesive sheet does not contain a silicone component, the adhesive sheet does not cause contamination which would otherwise be caused by outgas and eluted substances, keeps sufficient elasticity at high temperatures, and hardy leaves adhesive deposits. Furthermore, the appropriate content of rubber component contained in the adhesive adds flexibility to the adhesive without impairing the heat resistance, thereby improving the machinability during cutting of the heat-resistant adhesive sheet for semiconductor device fabrication.

The epoxy resin component of the adhesive layer preferably has a weight per epoxy equivalent of less than or equal to 1000 g/eq. A weight per epoxy equivalent of 1000 g/eq or less makes the crosslink density moderate and therefore can more reliably inhibit adhesive deposits during peeling.

A heat-resistant adhesive sheet for semiconductor device fabrication, an adhesive used in an adhesive layer of the heat-resistant adhesive sheet for semiconductor device fabrication, and a method for fabricating a semiconductor device using the heat-resistant adhesive sheet according to the present invention will be described below in detail with reference to drawings.

Figure 1:
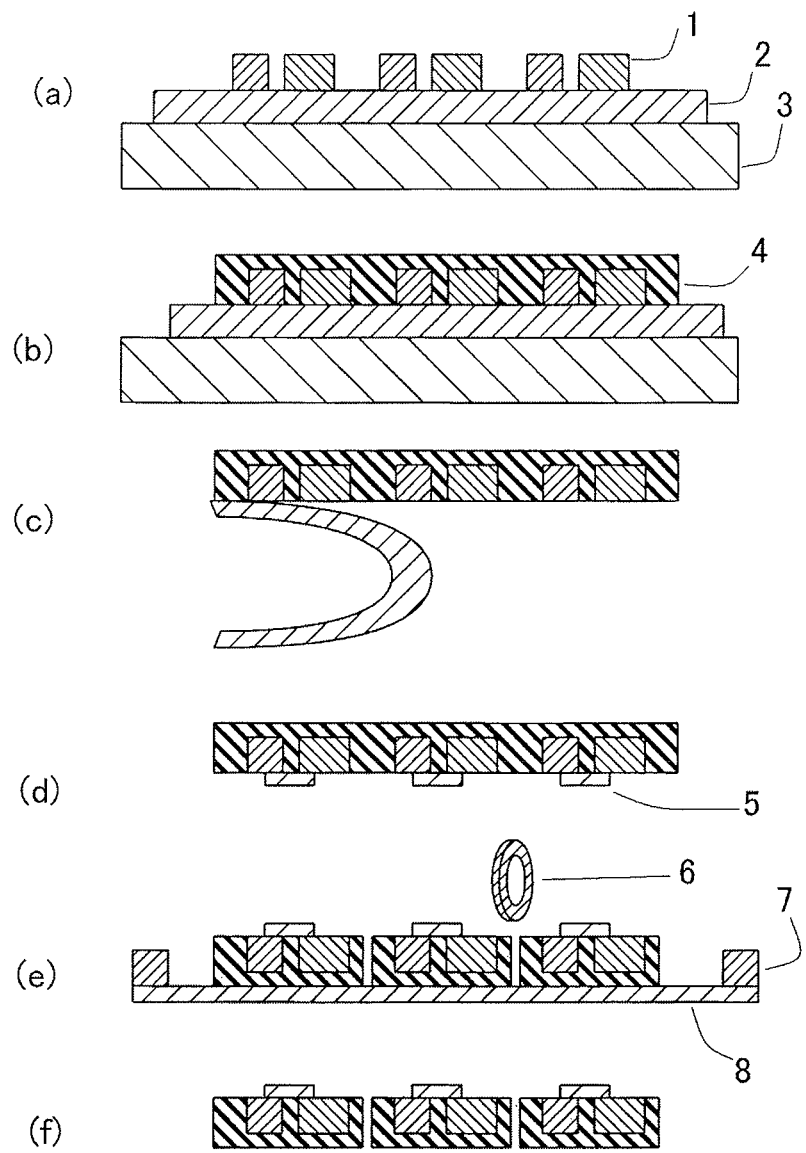
FIG. 1 is a schematic diagram of a method for fabricating a substrateless package.
Figure 2:
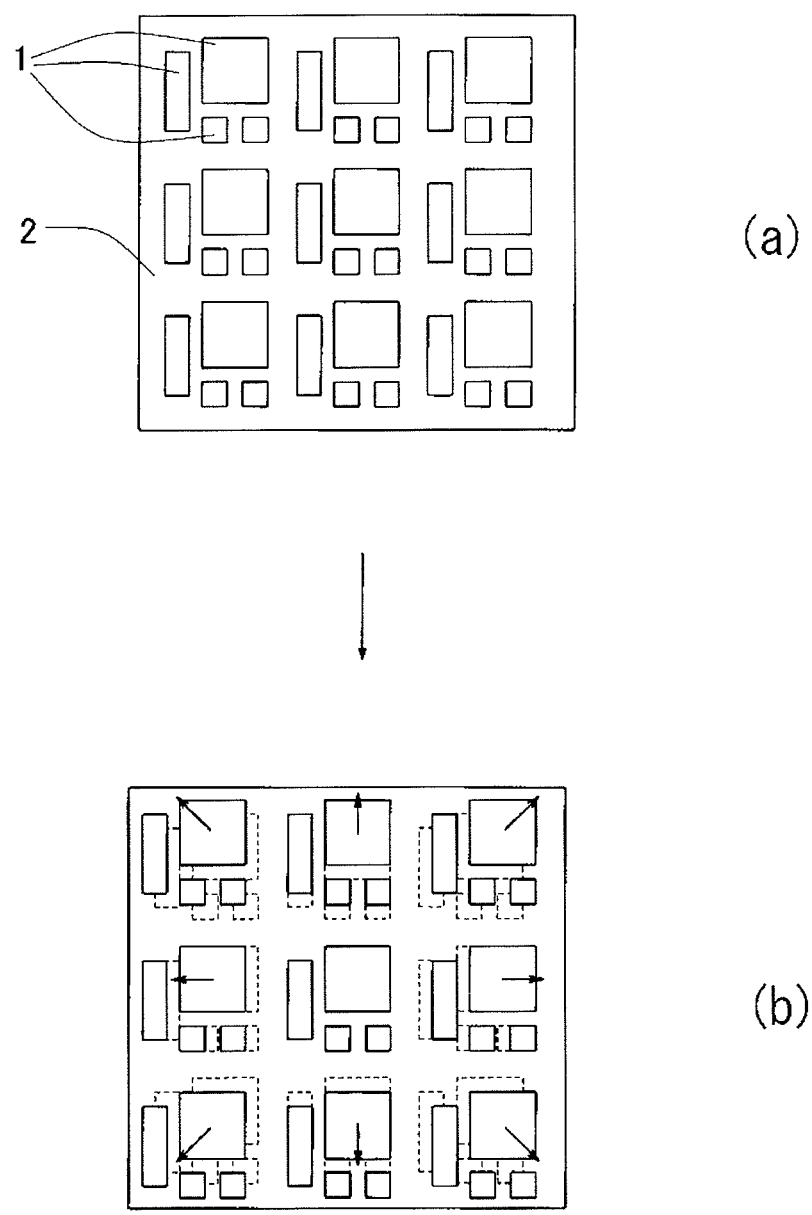
FIG. 2 is a diagram illustrating deformation of a heat-resistant adhesive sheet for semiconductor device fabrication on which chips are mounted by heat during encapsulation with encapsulation resin.
Figure 3:
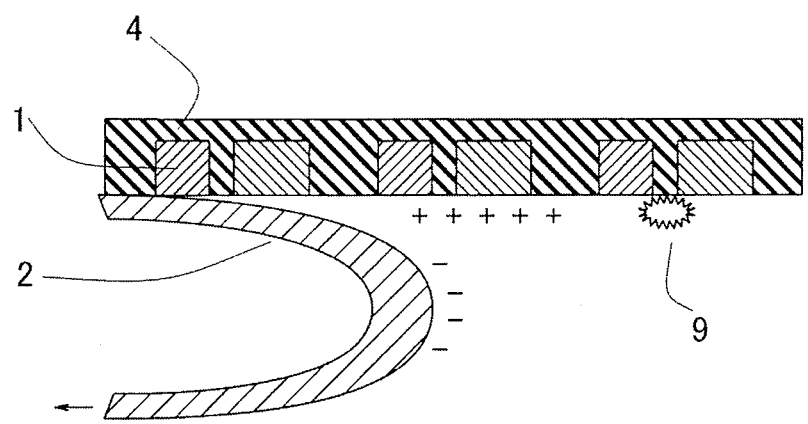
FIG. 3 is a diagram illustrating static electricity build-up and adhesive deposits that occur when a heat-resistant adhesive sheet for semiconductor device fabrication is removed.
Figure 4:
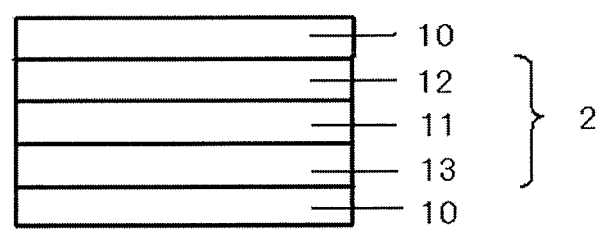
FIG. 4 is a cross-sectional view of a heat-resistant adhesive sheet for semiconductor device fabrication according to the present invention.

FIG. 4 is a cross-sectional view of a heat-resistant adhesive sheet 2 for semiconductor device fabrication. The heat-resistant adhesive sheet 2 for semiconductor device fabrication includes a base material layer 11 and an adhesive layer 12. A substrate fixing bond layer 13 may be formed on the surface of the base material layer on which the adhesive layer is not provided, so that the heat-resistant adhesive sheet 2 for semiconductor device fabrication having chips 1 fixed on the adhesive layer 12 can be fixed onto a substrate 3. The adhesive layer 12 is a layer of an adhesive containing a rubber component and an epoxy resin component.

Flat, smooth peeling sheets 10 that protect the surfaces of the adhesive layer 12 and the substrate fixing bond layer 13 may also be provided.

[Adhesive Layer 12]
(Rubber Component)

Examples of the rubber component used include NBR (acrylonitrile-butadiene rubber), acrylic rubber, acid terminated nitrile rubber, and thermoplastic elastomer. Examples of commercially available rubber components include NiPol 1072 (from Zeon Corporation) and Nipol-AR51 (from Zeon Corporation). Among them, NBR is preferably used in terms of compatibility with epoxy resin. In particular, NBR having an acrylic nitrile content of 10 to 50% is preferable.

The aim of addition of the rubber component is to impart flexibility to the adhesive. However, the heat resistance decreases as the content of the rubber component increases. In view of this, the proportion of the rubber component in an organic substance in the adhesive layer is preferably in the range of 20 to 60 wt %, more preferably 20 to 50 wt %. A proportion in the range of 20 wt % to 60 wt % can suppress reduction in flexibility of the adhesive layer and maintain the machinability in cutting of the heat-resistant adhesive sheet for semiconductor device fabrication. In addition, such a content can suppress reduction in heat resistance and suppress adhesive deposits.

(Epoxy Resin Component)

Examples of the epoxy resin component include a compound containing two or more epoxy groups in its molecule, such as glycidyl amine-type epoxy resin, bisphenol F-type epoxy resin, bisphenol A-type epoxy resin, phenol novolac-type epoxy resin, cresol novolac-type epoxy resin, biphenyl-type epoxy resin, naphthalene-type epoxy resin, aliphatic epoxy resin, acrylic epoxy resin, heterocyclic epoxy resin, spiro-ring-containing epoxy resin, and halogenated epoxy resin. These components can be used either singly or in combination. Among these, bisphenol A-type epoxy resin is especially preferable in terms of peelability from the encapsulation resin 4 after the encapsulation step.

The proportion of the epoxy resin component is preferably in the range of 40 to 80 wt %, more preferably 50 to 70 wt %, for 100 wt % of an organic substance. 40 wt % to 80 wt % of epoxy resin allows the adhesive to cure sufficiently and to have high heat resistance. The proportion of the epoxy resin also can suppress reduction of the flexibility and maintain high machinability. The epoxy resin has a weight per epoxy equivalent of less than or equal to 1000 g/eq, preferably less than or equal to 700 g/eq, yet preferably less than or equal to 300 g/eq. A weight per epoxy equivalent of 1000 g/eq or less can suppress reduction in crosslink density, prevent increase of bonding strength after curing, and suppress adhesive deposits during peeling after encapsulation.

(Composition of Adhesive)

A conductive filler can be blended in the adhesive layer 12 of the present invention. The conductive filler adds an antistatic property to the adhesive layer 12 and therefore prevents buildup of static charge in the heat-resistant adhesive sheet 2 for semiconductor device fabrication and chips during peeling of the adhesive sheet 2 from the chips after use.

The heat-resistant adhesive sheet for semiconductor device fabrication of the present invention fixes chips before the chips are encapsulated with resin and can be smoothly peeled away from the chips and the resin used for the encapsulation after the encapsulation with resin. The resin encapsulation is performed at approximately 175° C. The heat-resistant adhesive sheet for semiconductor device fabrication of the present invention needs to be able to be used with stable quality and not excessively stretch at such high temperature. The adhesive layer should not soften at such high temperature.

Preferably, a curing agent that cures epoxy resin, which is a curable component, is added to the adhesive layer 12 of the present invention. Examples of the epoxy resin curing agent that can be used include phenol resin, imidazole-based compounds and their derivatives, hydrazide compounds, dicyandiamide, and microencapsulates of these. In particular, if phenol resin is used as the curing agent, a phosphorous compound such as triphenyl phosphine can be used as a curing accelerator.

If phenol resin is chosen as the curing agent, a portion of the additive amount of epoxy resin can be replaced with phenol resin so that the equivalent weight of the curing agent is approximately equal to the equivalent weight of epoxy resin.

The proportion of other curing agent and the curing accelerator is in the range of 0.5 to 5 wt %, preferably 0.5 to 3 wt %, for 100 wt % of organic substance.

Known additives such as an inorganic filler, an organic filler, pigment, an anti-aging agent, a silane coupling agent, and a tackifier can be added to the adhesive layer as required, as long as the properties of the heat-resistant adhesive sheet for semiconductor device fabrication are not degraded. In particular, addition of the anti-aging agent is effective for inhibiting deterioration at high temperature.

[Base Material Layer 11]

A material for the base material layer 11 is not limited to a particular type. Any base material that is heat-resistant under heating conditions during resin encapsulation can be used. Since the resin encapsulation step is performed typically at a temperature around 175° C., a base material used is preferably heat-resistant so that the base material does not significantly contract or the base material layer 11 itself is not damaged at such temperatures. Accordingly, the base material has preferably a linear thermal expansion coefficient of $0.8 \times 10^{-5}$ to $5.6 \times 10^{-5}$/K at a temperature of 50 to 250° C.

If a base material that has a glass transition temperature lower than the heating temperature for curing the encapsulation resin 4 is used as the base material, the linear thermal expansion coefficient of the base material in a range of temperatures higher than the glass transition temperature will be higher than the linear thermal expansion coefficient in a range of temperatures lower than the glass transition temperature. Accordingly, displacement of adhered chips 1 from specified positions will increase.

In addition, a uniaxially- or biaxially-stretched base material, which was stretched at a temperature higher than its glass transition temperature, starts contracting at a temperature lower than the glass transition temperature, which also increases displacement from the specified positions of the adhered chips. The positional accuracy of the chips can be improved by choosing a material that has a glass transition temperature higher than 180° C. as the material of the base material layer 11 of the heat-resistant adhesive sheet 2 which is attached to the substrateless semiconductor chips without a metal lead frame when the chips are encapsulated with resin can.

Examples of such a base material include heat-resistant plastic films such as a polyethylene naphthalate (PEN) film, polyethylene sulfone (PES) film, polyetherimide (PEI), a polyethersulfone (PSF) film, a polyphenylene sulfide (PPS) film, a polyether ether ketone (PEEK) film, a polyarylate (PAR) film, an aramid film, and liquid crystal polymer (LCP).

If the temperature at which the resin encapsulation is performed is less than or equal to 150° C., a polyethylene terephthalate (PET) film can be used.

The heat-resistant base material layer 11 may be made of a paper base material such as glassine paper, quality paper, or Japanese paper, or nonwoven fabric base material of cellulose, polyamide, polyester, aramid, or the like, or a metal film base material such as aluminum foil, SUS foil, or Ni foil. These materials may be stacked to form the base material layer 11.

The thickness of the base material layer 11 is 10 to 200 μm, preferably 25 to 100 μm, in order to prevent a rip and break. A thickness of 10 μm to 200 μm provides a good handling ability.

[Substrate Fixing Bond Layer 13]

A bond used for the substrate fixing bond layer 13 may be a material that has such bonding strength that the substrate fixing bond layer 13 can be peeled away from the substrate 3 or the base material layer 11, or may be the same adhesive as that of the adhesive layer 12.

Peeling of the heat-resistant adhesive sheet 2 away from the substrate 3 can be facilitated by heating if for example a blowing agent that is foamed by heat is added to the substrate fixing bond layer 13. Instead of means that changes by heat, a component that forms cross-links under UV irradiation, for example, can be added to the substrate fixing bond layer 13 beforehand so that the substrate fixing bond layer 13 is cured, thereby reducing adhesion strength of the substrate fixing bond layer 13.

By such treatment, the adhesion strength of the substrate fixing bond layer 13 is reduced to separate the substrate 3 and the substrate fixing bond layer 13 from each other, or to separate the base material layer 11 and the substrate fixing bond layer 13 from each other, thereby removing the chips encapsulated with resin from the substrate 3.

[Flat, Smooth Peeling Sheet 10]

The flat, smooth peeling sheet 10 is formed of a base material film having a peeling agent layer formed on one side of the base material film and is peeled to expose the adhesive layers on both sides before the heat-resistant adhesive sheet 2 for semiconductor device fabrication is used.

The peeling agent layer contains a known peeling agent, such as a known fluorinated silicone resin-based peeling agent, a fluororesin peeling agent, a silicone resin-based peeling agent, polyvinyl alcohol-based resin, polypropylene-based resin, or long-chain alkyl compound, chosen according to the type of resin of the adhesive layer.

The base material film may be any known film chosen from plastic films, such as polyether ketone, polyetherimide, polyarylate, polyethylene naphthalate, polyethylene, polypropylene, polybutene, polybutadiene, polymethylpentene, polyvinyl chloride, vinyl chloride copolymer, polyethylene terephthalate, polybutylene terephthalate, polyurethane, ethylene vinyl acetate copolymer, ionomeric resin, ethylene-(meth)acrylic acid copolymer, ethylene-(meth)acrylic acid ester copolymer, polystyrene, and polycarbonate films.

[Fabrication of Heat-Resistant Adhesive Sheet 2 for Semiconductor Device Fabrication]

According to the present invention, compositions prepared as described above can be used to form a heat-resistant adhesive sheet for semiconductor device fabrication by any of method generally used for fabricating a multilayer structure. In one method, the composition is dissolved in a solvent, then is applied to a base material film, and dried by heating to form a heat-resistant adhesive sheet for semiconductor device fabrication. In another method, the composition is dissolved in a solvent to make an aquatic dispersion solution, and the solution is applied to a base material film and dried by heating to form a heat-resistant adhesive sheet for semiconductor device fabrication.

The solvent is preferably, but is not limited to, a ketone-based solvent, such as methyl ethyl ketone, which provide a good solubility.

The heat-resistant adhesive sheet 2 for semiconductor device fabrication of the present invention includes the adhesive layer thus formed to a typical thickness of 1 to 50 μm on the base material layer and is used in the form of a sheet or tape, or other form.

The heat-resistant adhesive sheet 2 for semiconductor device fabrication can be provided with an antistatic function as required. A method for providing an antistatic function to the heat-resistant adhesive sheet 2 for semiconductor device fabrication is to add an antistatic agent or conductive filler to the adhesive layer 12 and the base material layer 11. Another method is to provide an antistatic agent layer at the interface between the base material layer 11 and the adhesive layer 12 or between the base material layer 11 and the substrate fixing bond layer 13. The antistatic function can suppress buildup of static electricity caused while the heat-resistant adhesive sheet 2 for semiconductor device fabrication is being peeled off from the semiconductor device.

The antistatic agent may be any agent that has the antistatic capability. Examples of the antistatic agent include surfactants such as acrylic-based ampholytic, acrylic-based cation, and maleic anhydride-styrene-based anion.

Examples of the material for the antistatic layer include Bondeip PA, Bondeip PX, and Bondeip P (from Konishi Co., Ltd.). The conductive filler may be a conventional one, for example a metal such as Ni, Fe, Cr, Co, Al, Sb, Mo, Cu, Ag, Pt, or Au, or an alloy or oxide of any of these, or a carbon such as carbon black. These materials can be used either singly or in combination.

The conductive filler may be powdery or fibrous filler.

The heat-resistant adhesive sheet 2 for semiconductor device fabrication thus fabricated has an excellent heat resistance and a good demoldability from packages and therefore is suited for use in a semiconductor device manufacturing process.

WORKING EXAMPLES

A measuring method used in working examples is as follows.

Initial adhesion strength to SUS: Peel adhesion strength to a SUS304BA plate at an angle of 180° at room temperature Peel strength from package: Peel adhesion strength at an angle of 180° when the adhesive tape is peeled from the package Chip displacement: Displacement from the initial position of a chip measured with a digital microscope after package fabrication Adhesive deposit: The surface of the package was visually checked for adhesive deposits after the adhesive tape was peeled off.

The present invention will be descried more specifically with respect to working examples. The term "part" in the following description means "part by weight".

Working Example 1

42 parts of acrylonitrile-butadiene rubber (Nipol 1072) from Zeon Corporation), 53 parts of bisphenol A-type epoxy resin (Epikote 828 from Japan Epoxy Resin Co., Ltd., with a weight per epoxy equivalent of 190 g/eq), and 5 parts of imidazole (C1 1Z from Shikoku Chemicals Corporation) were blended and dissolved in an MEK solvent to a concentration of 35 wt % to prepare a bond solution. The bond solution was applied to a 35-μm-thick copper foil serving as a base material film, and was then dried at 150° C. for 3 minutes to form an adhesive layer having a thickness of 10 μm, thus forming a heat-resistant adhesive sheet for semiconductor device fabrication.

A 3 mm×3 mm Si wafer chip was placed on the heat-resistant adhesive tape, epoxy-based encapsulation resin powder (GE-740LA from Nitto Denko Corporation) was sprinkled over the tape and the wafer chip, and then molded by heating at a temperature of 175° C. under a pressure of 3.0 kg/cm² for 2 minutes. Then the structure was heated at 150° C. for 60 minutes to accelerate curing of the resin (post-mold cure) to complete a package.

Working Example 2

24 parts of acrylonitrile-butadiene rubber (Nipol 1072) from Zeon Corporation), 65 parts of bisphenol A-type epoxy resin (Epikote 1002 from Japan Epoxy Resin Co., Ltd., with a weight per epoxy equivalent of 650 g/eq), 10 parts of phenol resin (P-180 from Arakawa Chemical Industries, Ltd.), and 1 part of triphenylphosphane (TPP from Hokko Chemical Industry) were blended and dissolved in an MEK solvent to a concentration of 35 wt % to prepare an adhesive solution. The adhesive solution was applied to a 35-μm-thick copper foil serving as the base material film, and was then dried at 150° C. for 3 minutes to form an adhesive layer having an adhesive thickness of 10 μm, thus forming a heat-resistant adhesive sheet for semiconductor device fabrication. The rest of the method for fabricating the package was the same as that in Working Example 1.

Comparative Example 1

70 parts of acrylonitrile-butadiene rubber (Nipol 1072) from Zeon Corporation), 28 parts of bisphenol A-type epoxy resin (Epikote 828 from Japan Epoxy Resin Co., Ltd., with a weight per epoxy equivalent of 190 g/eq), and 2 parts of imidazole (C1 1Z from Shikoku Chemicals Corporation) were blended and were dissolved in an MEK solvent to a concentration of 35 wt % to prepare an adhesive solution. The adhesive solution was applied to a 35-μm-thick copper foil serving as a base material film and was then dried at 150° C. for 3 minutes to form an adhesive layer having an adhesive thickness of 10 μm, thus forming a heat-resistant adhesive sheet for semiconductor device fabrication. The rest of the method for fabricating the package was the same as that in Working Example 1.

Comparative Example 2

10 parts of acrylonitrile-butadiene rubber (Nipol 1072) from Zeon Corporation), 79 parts of bisphenol A-type epoxy resin (Epikote 1002 from Japan Epoxy Resin Co., Ltd., with a weight per epoxy equivalent of 650 g/eq), 10 parts of phenol resin (P-180 from Arakawa Chemical Industries, Ltd.), and 1 part of triphenylphosphane (TPP from Hokko Chemical Industry) were blended and dissolved in an MEK solvent to a concentration of 35 wt % to prepare an adhesive solution. The adhesive solution was applied to a 35-μm-thick copper foil serving as the base material film, and was then dried at 150° C. for 3 minutes to form an adhesive layer having an adhesive thickness of 10 μm, thus forming a heat-resistant adhesive sheet for semiconductor device fabrication. The rest of the method for fabricating a package was the same as that in Working Example 1.

In the adhesive tapes and packages fabricated as described above, the peel adhesion strength to an SUS304BA plate at an angle of 180° at room temperature (hereinafter referred to as the initial adhesion strength), the peel adhesion strength when the adhesive tape is actually peeled off from a package (hereinafter referred to as peel strength), the displacement of the chip from its initial position, and adhesive deposits left after the adhesion tape was peeled were as given below.

TABLE 1

|  | Working example 1 | Working example 2 | Comparative example 1 | Comparative example 2 |
|---|---|---|---|---|
| Initial adhesion strength to SUS304 (N/20 mm) | 1.22 | 1.14 | 3.12 | 0.27 |
| Adhesion strength from package (N/20 mm) | 0.82 | 0.72 | 2.32 | 0.21 |
| Chip displacement | 0.1 mm | 0.1 mm | 1.0 mm | 2.9 mm |
| Adhesive deposit | Not found | Not found | Found | Not found |

As apparent from Table 1, the adhesive sheets of Working Examples 1 and 2 of the present invention exhibited an excellent demoldability for packages and did not left adhesive deposits. Furthermore, since the adhesive sheets had sufficient initial adhesion strength and the adhesive layers were not too soft, chip displacement by encapsulation resin was suppressed.

In contrast, the adhesive sheet of Comparative Example 1 with a large amount of rubber component unlike the ones of the present invention had sufficient initial adhesion strength but caused chip displacement during resin encapsulation because the adhesive layer was soft. In addition, the adhesive sheet had poor elasticity after cured and left adhesive deposits. The adhesive sheet of Comparative Example 2 with a small amount of rubber component had insufficient initial adhesion strength and therefore caused chip displacement during resin encapsulation.

What is claimed is:

1. A heat-resistant adhesive sheet for semiconductor device fabrication, the heat-resistant adhesive sheet being attached to a semiconductor chip when the semiconductor chip is encapsulated with resin, and the heat-resistant adhesive sheet is in direct physical contact with the semiconductor chip, wherein:

the adhesive sheet comprises a base material layer, an adhesive layer, and a fixing bond layer, wherein the adhesive layer contains a rubber component and an epoxy resin component, and the proportion of the rubber component in an organic substance in the adhesive is in the range of 20 to 60 wt %.

2. The heat-resistant adhesive sheet for semiconductor device fabrication according to claim 1, wherein the epoxy resin component has a weight per epoxy equivalent of less than or equal to 1000 g/eq.

3. An adhesive for a heat-resistant adhesive sheet for semiconductor device fabrication according to claim 1.

4. A semiconductor device fabrication method using a heat-resistant adhesive sheet for semiconductor device fabrication according to claim 1 to resin-encapsulate a semiconductor chip that does not use a metal lead frame.

5. The heat-resistant adhesive sheet for semiconductor device fabrication according to claim 1, wherein the fixing bond layer is on one side of the base material layer and the adhesive layer is on the opposite side of the base material layer.

6. A semiconductor device fabrication comprising a heat-resistant adhesive sheet attached to a semiconductor chip encapsulated with resin, wherein the heat-resistant adhesive sheet is in direct physical contact with the semiconductor chip, and the heat-resistant adhesive sheet comprises a base material layer, an adhesive layer, and a fixing bond layer, wherein the adhesive layer contains a rubber component and an epoxy resin component, and the proportion of the rubber component in an organic substance in the adhesive is in the range of 20 to 60 wt %.

* * * * *